United States Patent [19]

Handa et al.

[11] Patent Number: 5,222,163
[45] Date of Patent: Jun. 22, 1993

[54] INTEGRATED TYPE OPTICAL NODE AND OPTICAL INFORMATION SYSTEM USING THE SAME

[75] Inventors: Uuichi Handa, Atsugi; Hidetoshi Nojiri, Hadano; Hajime Sakata, Hiratsuka, all of Japan

[73] Assignee: Canon Kabushiki Kaisha, Tokyo, Japan

[21] Appl. No.: 814,444

[22] Filed: Dec. 30, 1991

Related U.S. Application Data

[63] Continuation of Ser. No. 718,927, Jun. 25, 1991, Pat. No. 5,109,444, which is a continuation of Ser. No. 415,763, Oct. 2, 1989, abandoned.

[30] Foreign Application Priority Data

Oct. 4, 1988 [JP] Japan ................................ 63-251453

[51] Int. Cl.⁵ .................................................. G02B 6/10
[52] U.S. Cl. ........................................................ 385/14
[58] Field of Search .................................... 385/13, 14

[56] References Cited

U.S. PATENT DOCUMENTS

| | | | |
|---|---|---|---|
| 4,740,050 | 4/1988 | Husain | 350/96.16 |
| 4,740,951 | 4/1988 | Lizet et al. | 385/14 |
| 4,955,718 | 9/1990 | Michel | 385/14 |
| 4,997,245 | 3/1991 | DuPuy et al. | 385/16 |

FOREIGN PATENT DOCUMENTS

| | | |
|---|---|---|
| 62-145225 | 12/1987 | Japan . |
| 3200105 | 9/1991 | Japan .................................... 385/14 |

OTHER PUBLICATIONS

Applied Physics Letters, vol. 52, No. 10, Mar. 7, 1988, pp. 767-769; J. Salzman et al.: "Cross coupled cavity semiconductor laser".

Optical Fiber Communication Conference and 6th Int. Conference on Integrated Optics and Optical Fiber Communication, THC3, p. 198; H. Inoue et al. "Optical amplification by monolithically integrated DFB lasers".

*Primary Examiner*—Akm E. Ullah
*Attorney, Agent, or Firm*—Fitzpatrick, Cella, Harper & Scinto

[57] ABSTRACT

This specification discloses an integrated type optical node comprising a substrate, a channel light waveguide formed on the substrate for connecting the transmission lines of an optical information system, an amplifying portion provided on the light waveguide for amplifying a light propagated through the waveguide, and a light branching-off portion provided on the light waveguide for coupling a light transmitter and/or a light receiver to the transmission lines. The specification also discloses an optical information system using such optical node.

20 Claims, 8 Drawing Sheets

INTEGRATED TYPE OPTICAL NODE AND OPTICAL INFORMATION SYSTEM USING THE SAME

This application is a continuation of application Ser. No. 07/718,927, filed Jun. 25, 1991, now U.S. Pat. No. 5,109,444, which is a continuation of application Ser. No. 07/415,763, filed Oct. 2, 1989, now abandoned.

BACKGROUND OF THE INVENTION

1. Field of the Invention

This invention relates to an optical node for coupling the transmission lines of an optical information system to each end and an optical information system using the same.

2. Related Background Art

In a bus type optical information system, as shown in FIG. 1 of the accompanying drawings, optical nodes 102 are provided in a portion of an optical fiber bus line 101 and an end instrument 103 having the transmitting and receiving function is connected to each of the optical nodes, whereby the information transmission between the ends is effected through the bus line. As optical nodes used in such a bus system, there have been proposed various types such as (1) the light receiving and emitting type and (2) the passive light branching-off type.

The light receiving emitting type mentioned under item (1) above is a method in which after a light signal is converted into an electrical signal, a light signal is again transmitted, and a light emitting and receiving device is inserted on a bus line. This method, however, has suffered from a problem such as the time delay of the signal due to the delay of the reproduction time and in addition, a problem that the reproduction of a wavelength multiplexing signal is cumbersome.

On the other hand, the passive light branching-off type mentioned under item (2) above is such that as shown in FIG. 2 of the accompanying drawings, a T-shaped branching-off coupler 104 is installed on a bus line 101 and the introduction of a signal on the bus line and the transmission of the signal to the bus line are effected to thereby realize the information transmission between optical nodes. A receiving unit 106 and a transmitting unit 107 are connected under the T-shaped branching-off coupler 104 through a Y-shaped branching-off coupler 105. However, in such a passive type optical branching-off node, the attenuation of light power due to the branch-off loss is remarkable, and this has led to the basic problem that the number of optical nodes installed is limited.

Also, the dynamic range of the signal on the bus line becomes great due to the branch-off coupling loss, and this has led to the problem that the burden for the performance of a photodetector becomes great.

In order to make up for such branch-off coupling loss, there is a method of inserting an optical amplifier 108 onto the bus line and directly amplifying the light signal, but this imparts a new coupling loss because of the increase in optical fiber coupling regions, and this in turn has led to the problem that a high amplification degree is required of the optical amplifier 108.

On the other hand, as similar examples in which an optical amplifier and a branching-off coupler are combined together, there have been proposed several, examples in which a compound type laser resonator is constructed.

For example, in I. H. A. Fattah et al., "Semiconductor interterometric laser", *Appl. Phys. Lett.* 41, 2, pp 112–114 (July, 1982), there is described an interference type laser including a y branch-off as shown in FIG. 3 of the accompanying drawings. Also, in J. Salzman et. al., "Cross coupled cavity semiconductor laser", *Appl. Phys. Lett.* 52, 10, pp. 767–769 (March, 1988), there is described an interference type laser including x branch-off as shown in FIGS. 4A and 4B of the accompanying drawings. Here, $R_1$–$R_4$ designate resonating surfaces, and $L_1$–$L_4$ indicate the lengths of resonators.

Further, in Japanese Laid-Open Patent Application No. 62-145225, it is proposed to compensate for branch-off loss by the use of such a branching-off type laser.

However, it has not at all been conceived to utilize these lasers as the node of an optical information system.

SUMMARY OF THE INVENTION

It is the object of the present invention to solve the above-noted problems peculiar to the optical node according to the prior art and to provide an efficient integrated type optical node which makes up for light branch-off coupling loss and makes the coupling between a transmitter-receiver and a transmission line possible in both directions.

The above object of the present invention is achieved by an integrated type optical node comprising a substrate, a channel light waveguide formed on said substrate for connecting the transmission line of an optical information system, an amplifying portion provided on said light waveguide for amplifying a light propagated through said waveguide, and a light branching-off portion provided on said light waveguide for coupling a light transmitter and/or a light receiver to said transmission line.

DESCRIPTION OF THE PREFERRED EMBODIMENTS

Figure 1:
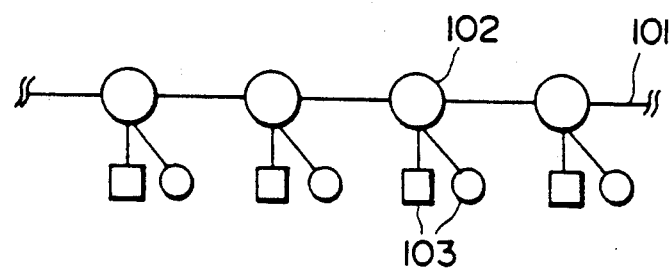
FIG. 1 is a conceptional view for illustrating an optical bus system.
Figure 2:
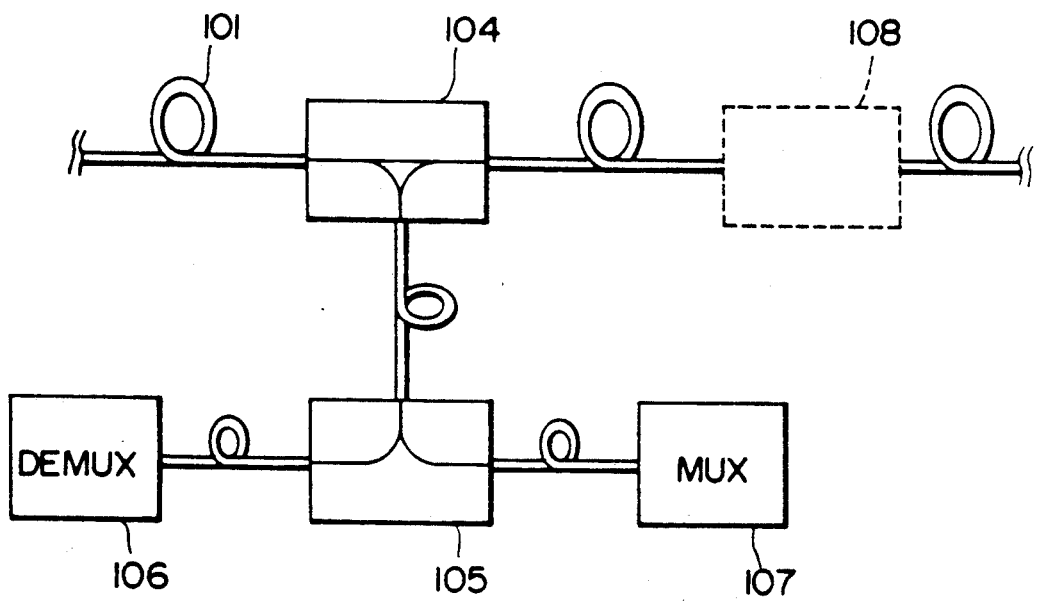
FIG. 2 is a conceptional view of a passive branching-off type optical node which is an example of the prior art.
Figure 3:
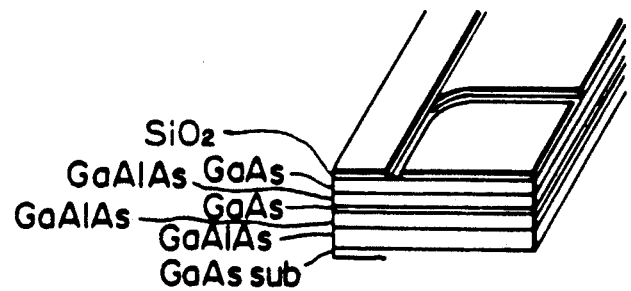
FIGS. 3, 4A and 4B are schematic views showing examples of an interference type laser having branch-off in a laser amplifier.
Figure 4A:
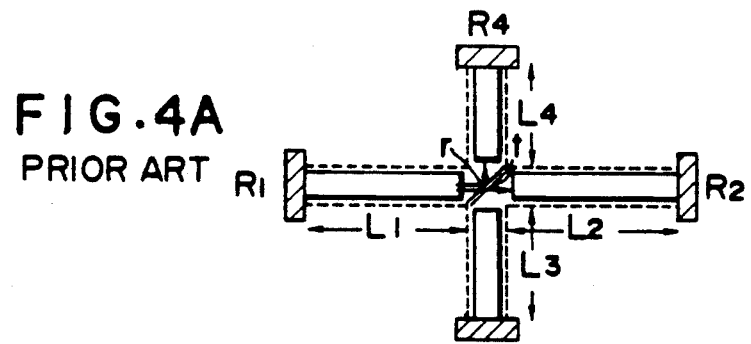
Figure 4B:
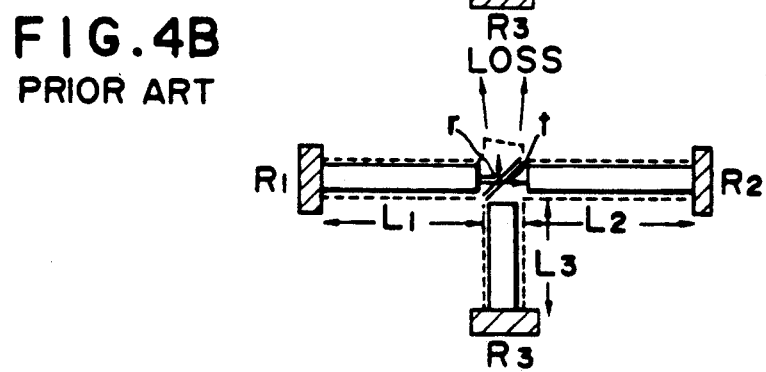
Figure 5:
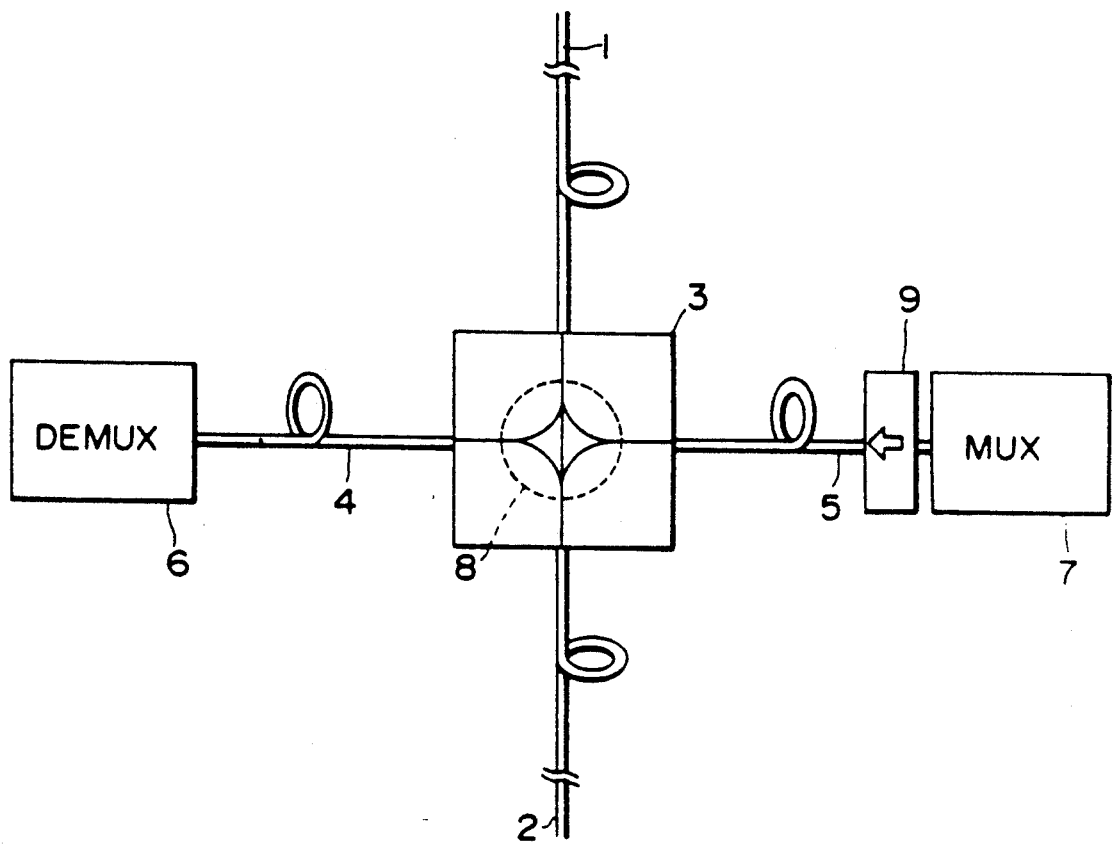
FIG. 5 is a block diagram illustrating the optical node of the present invention.

FIG. 5 illustrates the basic concept of the present invention. In FIG. 5, the reference numerals 1 and 2 designate optical fibers which are optical bus lines, and the reference numeral 3 denotes an integrated optical node according to the present invention which contains a bidirectional branching-off coupler in an optical amplifier. The reference numerals 6 and 7 designate a receiver and a transmitter, respectively, for end connection, the reference numerals 4 and 5 denote optical fibers for connecting the receiver 6 and the transmitter 7 to the integrated optical node 3, the reference numeral 8 designates a branching-off coupler, and the reference numeral 9 denotes an isolator.

The operation of the integrated optical node 3 will hereinafter be described.

When a multiplexed light signal is transmitted from the transmitter 7, it is coupled from the optical fiber 5 to the branch-off waveguide of the integrated optical node 3 and is separated into both directions, whereafter it is optically amplified, and the light signal is transmitted toward the optical fibers 1 and 2.

Design can be made such that the insertion loss of the coupling portion between the optical fibers and the optical node and the excessive loss of the bidirectional light branching-off coupler 8 are compensated for by an optical amplifying portion included in the integrated optical node 3 and the light signal on the bus line assumes a substantially constant output level.

On the other hand, in the case of reception, the light signal which has come from the optical fiber 1 or 2 which is a bus line is optically amplified in the integrated optical node 3. With that, the light signal which has come from any of the optical fibers 1 and 2 can also be partly introduced into the branch-off waveguide on the receiving side by the branching-off coupler 8. The branched-off light signal is input to the receiver 6 through the optical fiber 4 and is divided and detected thereby, and giving and receiving of desired information can be effected.

A part of the signal on the bus line always rectilinearly travels through the branching-off coupler 8 and is amplified by the amplifying portion, whereby the branch-off and coupling losses are compensated for and the signal level on the bus line is kept constant.

Figure 6:
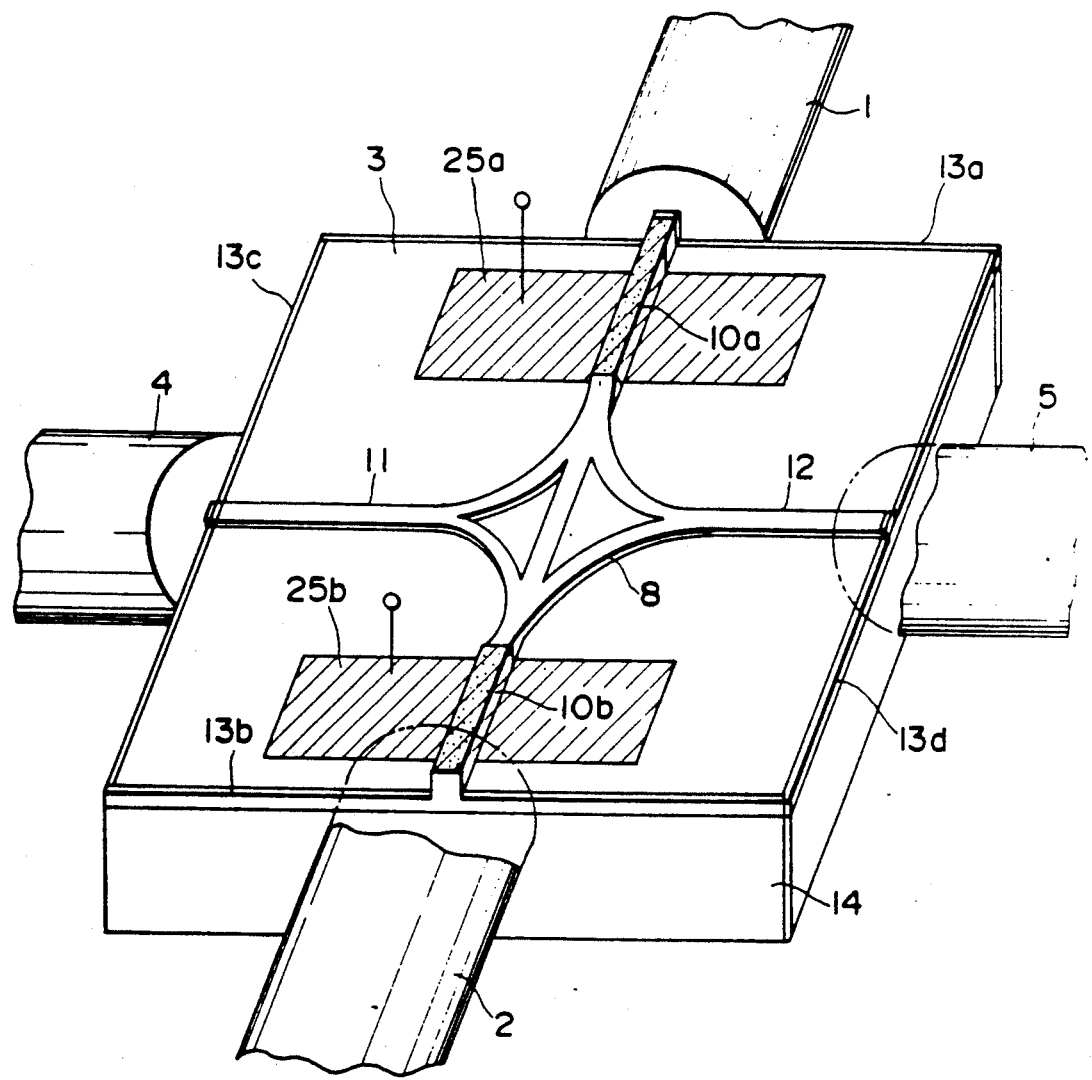
FIG. 6 is a schematic view of an optical node according to a first embodiment of the present invention.

FIG. 6 shows the device construction of the integrated optical node of the present invention. The integrated optical node has a ridge-shaped waveguide structure in which a GaAs/AlGaAs epitaxial layer is formed on a GaAs substrate 14 and stripe-like convex portions are formed on said layer. Laser amplifying portions 10a and 10b which are optical amplifying portions are provided on the straight bus line, and directly amplify the light signal on the bus line. These laser amplifying portions may desirably be travelling wave type laser amplifiers which do not form resonators, and for that purpose, non-reflecting coatings 13a-13d are applied to the input and output portions to eliminate any unnecessary reflecting portion in the optical node. Also, in the branching-off coupler 8, it is necessary to effect tapering to suppress unnecessary reflection.

The branching-off coupler 8 comprises a passive light waveguide which does not provide a gain, and is formed by a compound of a three-branch-off waveguide and a two-branch-off (Y branch-off) waveguide in order to provide the bidirectional coupling of a reception side branch-off waveguide 11 and a transmission side branch-off waveguide 12. The feature of this branching-off coupler is that there is a rectilinearly travelling portion toward the bus line and a light signal can be transmitted in the both directions of the bus line from the branch-off waveguides 11 and 12 for reception and transmission and the light signal can be introduced from the both directions of the bus line.

Butt coupling is used for the coupling of the input and output port and the optical fiber.

Figure 7:
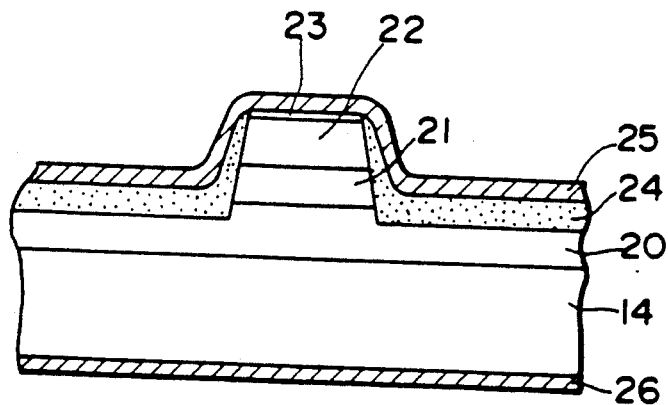
FIG. 7 is a cross-sectional view of a laser amplifying portion in the first embodiment.

FIG. 7 is a cross-sectional view of the laser amplifying portion. In FIG. 7, the reference numeral 14 designates an n-GaAs substrate, the reference numeral 20 denotes an n-AlGaAs clad layer, the reference numeral 21 designates a graded-index separate confinement heterostructure (GRIN-SCH) layer including a GaAs activated layer of multiplex quantum well (MQW) structure, the reference numeral 22 denotes a P-AlGaAs clad layer, the reference numeral 23 designates a GaAs cap layer, and the reference numerals 25 and 26 denote Au electrodes. The ridge is made by forming a pattern by photolithography, and thereafter by reactive ion beam etching. An SiNx layer 24 is piled, whereafter a window is formed only in the upper portion of the ridge, and electrode formation is effected. By biasing this laser amplifying portion by an electric current of a threshold value or less, the amplification of the incident light can be accomplished.

In the foregoing description, the branching-off coupler 8 and the branch-off waveguides 11 and 12 have been described as passive waveguides, but it is also possible to make these portions into optical amplifying portions.

Figure 8:
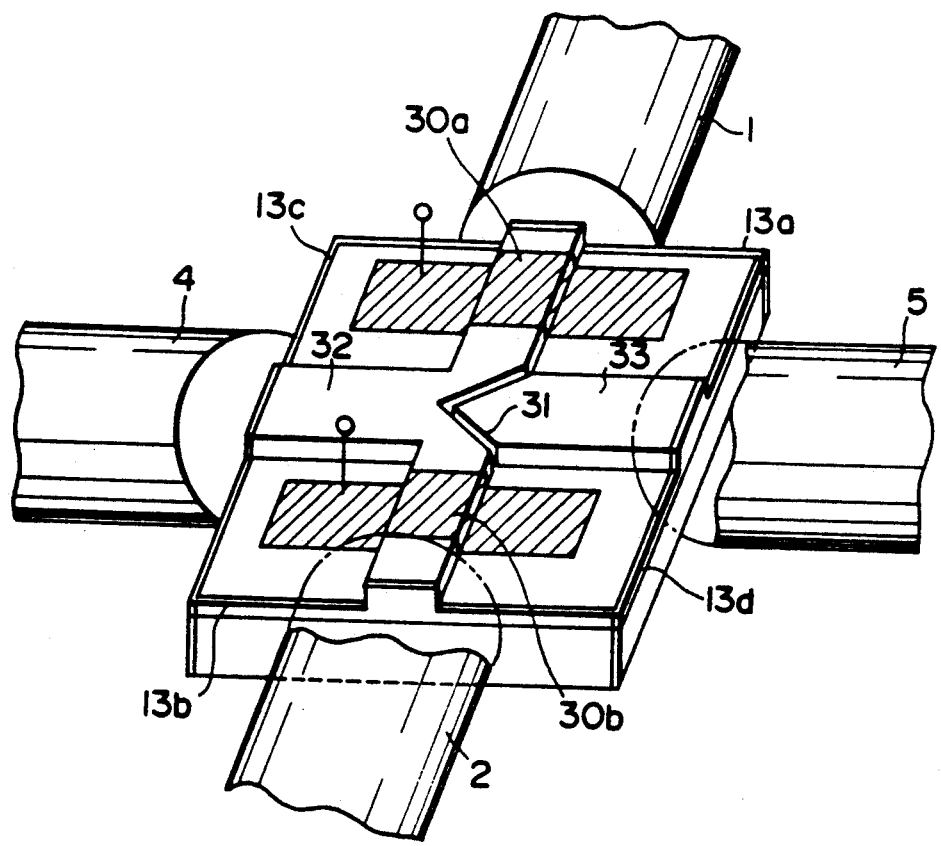
FIG. 8 is a schematic view of an optical node according to a second embodiment of the present invention.

FIG. 8 is a schematic view showing a second embodiment of the present invention. In the present embodiment, optical amplifying portions 30a and 30b disposed in the direction of the bus line are formed, and branch-off waveguides 32 and 33 to the receiving portion and the transmitting portion intersect the waveguide in the direction of the bus line. A branching-off coupler 31 accomplishes branching-off coupling by forming a V-shaped groove in the portion of intersection. The ratio of the branching-off coupling can be adjusted by controlling the distribution of the opto-electromagnetic field of the waveguide and the depth of the groove. For the formation of such a groove, utilization can be made of a minute working technique such as the etching by a Ga focused ion beam (FIB) or the etching by a reactive ion beam (RIB).

The other portions than the branching-off coupler 31 can be realized by a construction similar to that of the aforedescribed first embodiment.

The V-shaped branching-off coupler in the present embodiment differs in the ratio of branch-off to the left and right branch-off waveguides 32 and 33. Usually, in order to enhance the coupling of the receiving portion, the lower portion of the V-shape may preferably be disposed toward the reception side branch-off waveguide 32. If the ratio of branch-off of the groove is −3 dB and the excessive loss is neglected, the ratio of branch-off to the reception side is −3 dB and the ratio of branch-off to the transmission side is −6 dB. Also, when light is incident on the upper portion (the open side) of the V-shape, there is reflection of −6 dB and therefore, in order to stabilize the frequency on the transmission side, it is desirable to insert the isolator 9 as shown in FIG. 6.

In the above-described first and second embodiments, the optical node portion and the transmitting and receiving portions have been formed on different chips and the connection therebetween has been effected. In the embodiment shown in FIG. 9, description will be made of a device in which the optical node portion and the transmitting and receiving portions are integrated on a single substrate. The transmitting portion comprises distributed Bragg reflection type laser diodes (DBR-LD) 40a and 40b capable of transmitting two different wavelengths, a wavelength-multiplexed light signal is transmitted by a Y wave superposing device 42. Light waves after Y wave combining further pass through an isolator 43 and enter a branching-off coupler 44. The isolator 43 can be realized by forming on a GaAs epitaxial film an epitaxial film consisting of CaMnTe by the molecular beam epitaxy (MBE) method, and constructing a reciprocal portion and a non-reciprocal portion, and a polarizing filter. Where the V-shaped branching-off coupler 44 is used, the quantity of light reflected to the transmitting portion is great and the necessity of the isolator 43 increases. Also, in the branching-off coupler comprising a three-branch-off coupler and a Y branch-off coupler as in the first embodiment, the influence of the return light of the receiving portion laser itself is small, but laser amplifiers 45a and 45b on the bus line effect travelling wave movement and therefore, it is necessary to eliminate the unnecessary reflection on the DBR portion and the isolator 43 is important.

Next, on the reception side, the light signal from the bus line is amplified by the optical amplifier 45a or 45b, whereafter it is directed to a branch-off waveguide 47 by the branching-off coupler 44 and is Bragg-diffracted by gratings 46a and 46b, and only a light signal of a desired wavelength is emitted to the slab waveguide portion on the side of the ridge waveguide. The selected light signal is detected by independent photodetectors 48a and 48b in conformity with the wavelength thereof. The layer construction of the photodetectors 48a and 48b is identical to that of the optical amplifying portions 45a and 45b, and these photodetectors can be made to operate as photodetectors by reverse bias being applied thereto.

Figure 9:
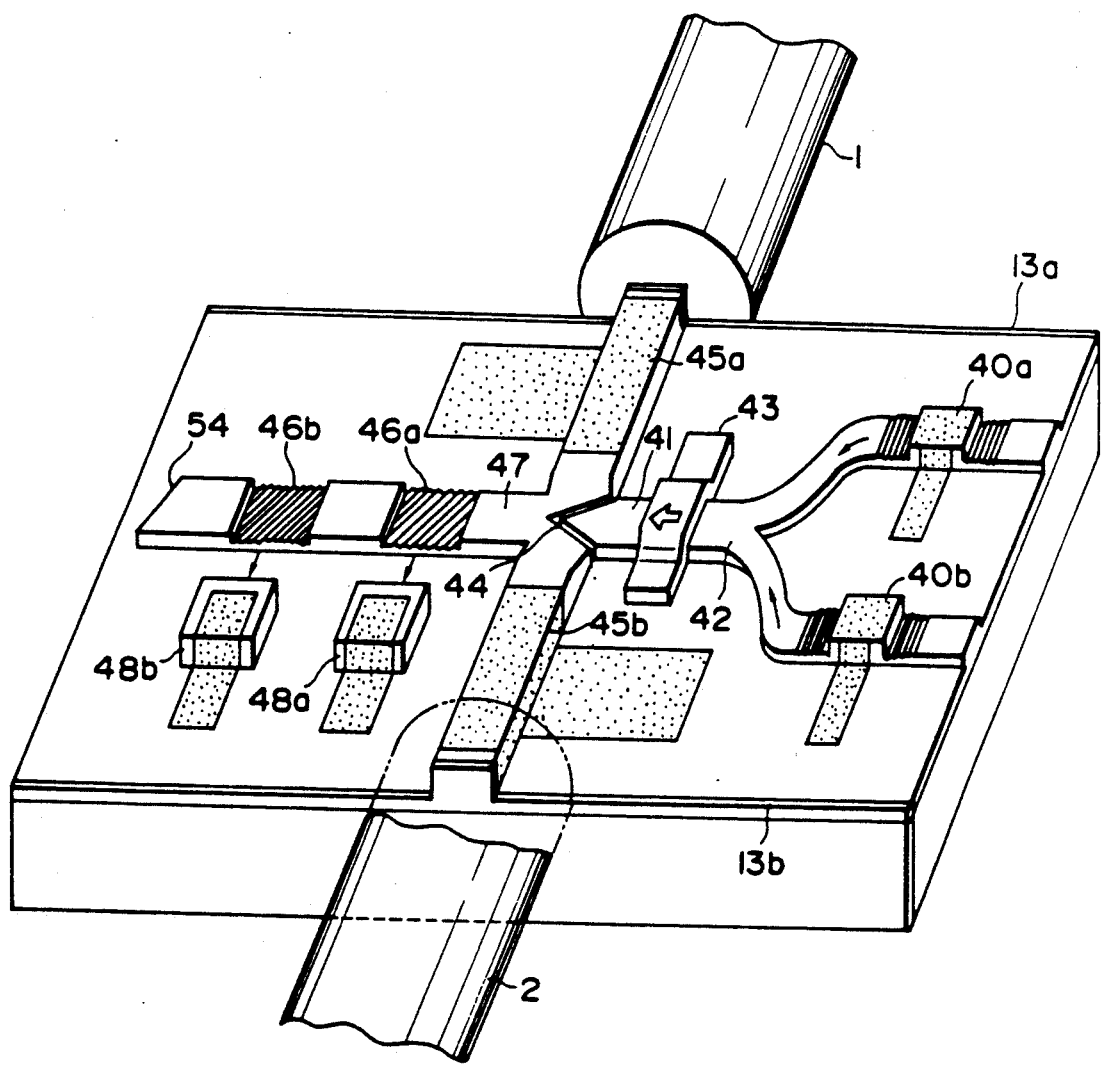
FIG. 9 is a schematic view showing a third embodiment of the present invention in which wavelength-multiplexed transmitting and receiving portions are made integral with each other.

On the reception side, no isolator is incorporated and therefore, it is necessary to make a contrivance such as obliquely setting a boundary 54 as shown in FIG. 9, or tapering the boundary, in order to suppress unnecessary reflection in each level difference portion. Of course, if isolators are installed on both branches, an improved performance can be expected.

The optical amplifiers and the branching-off coupler in the present embodiment have a wide wavelength band and therefore are considered to be useful as the integrated optical node of a wavelength-multiplexed optical bus system.

Figure 10:
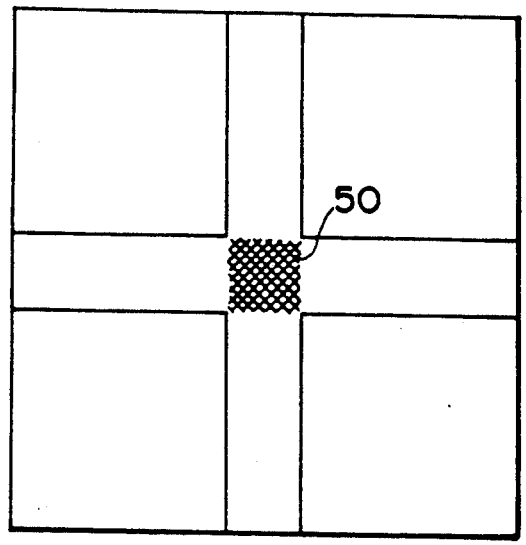
FIGS. 10 to 12 are schematic views illustrating other forms of the branching-off coupler portion.
Figure 11:
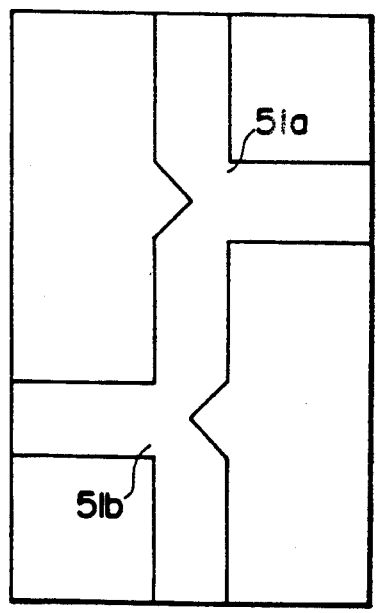
Figure 12:
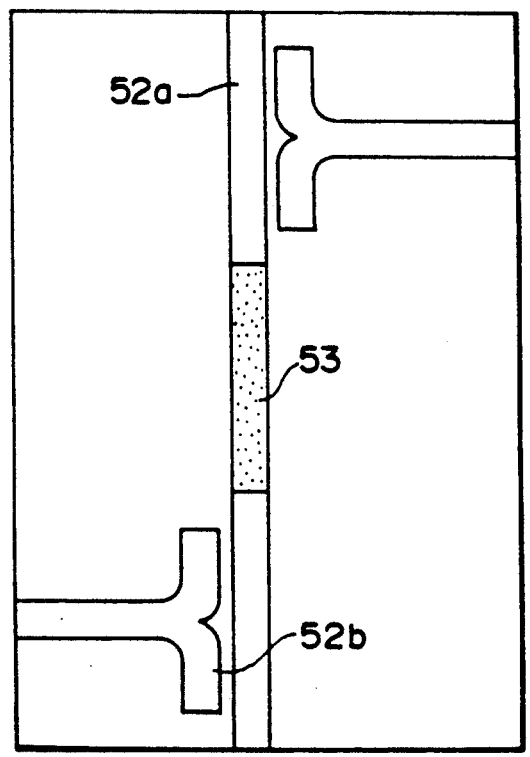

Besides the above-described embodiments, various constructions may be conceived as the construction of the bidirectional branching-off type coupler portion. FIG. 10 shows a construction in which a dual grating structure 50 is formed in the portion of intersection between waveguides to thereby realize bidirectional branching-off coupling. The grating can be locally formed by the electron beam exposure method or the like. In FIGS. 10 to 12, for simplicity, the other constituents such as the optical amplifying portion and the optical fiber are omitted.

FIG. 11 shows a construction in which two T-shaped branching-off couplers 51a and 51b are combined together to accomplish bidirectional coupling to the transmitting and receiving portions. Such T-shaped coupler can be provided by removing the central portion of a T-shaped waveguide in the form of a prism. In the prism-like portion, the guided light is designed to be subjected to total reflection.

FIG. 12 shows a construction in which two T-shaped branching-off couplers 52a and 52b of the directional coupler type are combined together to accomplish bidirectional coupling to the transmitting and receiving portions.

Branching-off devices of the directional coupler type and the grating diffraction type have wavelength dependency and therefore, it will be necessary to adjust the coefficient of coupling so as to have an appropriate wavelength selection width in the wavelength multiplexing area used. This poses no problem in a bus system of a single wavelength Designated by 53 is a laser amplifying portion.

As described above, in the integrated optical node of the present invention, a laser amplifying area for optical amplification and a branching-off coupler portion for bidirectionally accomplishing the coupling to a plurality of waveguides for the coupling to the transmitter and the receiver are provided in a channel waveguide, whereby it has become possible to compensate for the light branching-off and coupling loss as an optical node for an optical information system and bidirectionally accomplish the coupling between the transmitter, the receiver and the transmission line. Also, by using the integrated optical node of the present invention, the light power level on the transmission line can be made substantially equal and the multistage connection of the optical node becomes possible and also, the dynamic detection range of the photodetector can be made small and a higher performance of the information system can be achieved.

Further, by making the optical branching-off portion and the optical amplifying portion and the transmitting and receiving portions integral with one another, the number of the complicated coupling portions between the optical fiber and the waveguide can be reduced, and this is effective for making the element compact.

Besides the above-described embodiments, the present invention permits various applications. The present invention covers all of such applications without departing from the scope of the invention as defined in the appended claims.

We claim:

1. An integrated type optical node comprising:
   a substrate;
   a light waveguide formed on said substrate and coupled to transmission lines of an optical information system;
   first and second laser light sources integrated with said light waveguide formed on said substrate for emitting lights having different wavelengths from each other;
   first and second photodetectors integrated with said light waveguide formed on said substrate for receiving lights having different wavelengths from each other; and
   a light branching-off portion for coupling the lights emitted from said first and second laser light sources to said transmission lines through said light waveguide and for coupling a part of light transmitted in said transmission lines to said first and second photodetectors through said light waveguide.

2. An integrated type optical node according to claim 1, wherein said first and second laser light sources respectively comprise distributed Bragg reflection type laser diodes.

3. An integrated type optical node according to claim 1, wherein said branching-off portion comprises two three-forked branch-off paths and two-forked branch-off paths.

4. An integrated type optical node according to claim 1, wherein said branching-off portion comprises a V-shaped groove formed on said wavelengths.

5. An integrated optical node according to claim 1, where in said branching-off portion comprises a dual grating structure formed on said waveguide.

6. An integrated type optical node according to claim 1, wherein said branching-off portion comprises a prism-like removed portion formed on said waveguide.

7. An integrated type optical node according to claim 1, wherein said branching-off portion comprises two T-shaped branching-off couplers of a directional coupler type.

8. An integrated type optical node according to claim 1, further comprising an amplifying portion formed on a portion of said waveguide for amplifying light transmitted in said waveguide.

9. An integrated type optical node according to claim 8, where said amplifying portion comprises a laser amplifier for effecting operation of a traveling wave type.

10. An integrated type optical node according to claim 1, further comprising an isolator provided between said branching-off portion and said first and second laser light sources.

11. An optical information system comprising:
a plurality of integrated type optical nodes; and
a plurality of transmission lines for effecting transmission of light signals between said plurality of integrated type optical nodes;
wherein each of said plurality of integrated type optical nodes comprises:
a substrate;
a light waveguide formed on said substrate and coupled to said transmission lines;
first and second laser light sources integrated with said light waveguide formed on said substrate for emitting lights having different wavelengths from each other;
first and second photodetectors integrated with said light waveguide formed on said substrate for receiving lights having different wavelengths from each other; and
a light branching-off portion for coupling the lights emitted from said first and second laser light sources to said transmission liens though said light waveguide and for coupling a part of light transmitted in said transmission lines to said first and second photodetectors through said light waveguide.

12. An optical information system according to claim 11, wherein said first and second laser light sources respectively comprise distributed Bragg reflection type laser diodes.

13. An optical information system according to claim 11, wherein said branching-off portion comprises two three-forked branch-off paths and two-forked branch-off paths.

14. An optical information system according to claim 11, wherein said branching-off portion comprises a V-shaped groove formed on said waveguide.

15. An optical information system according to claim 11, wherein said branching-off portion comprises a dual grating structure formed on said waveguide.

16. An optical information system according to claim 11, wherein said branching-off portion comprises a prism-like removed portion formed on said waveguide.

17. An optical information system according to claim 11, wherein said branching-off portion comprises two T-shaped branching-off couplers of a directional coupler type.

18. An optical information system according to claim 12 further comprising an amplifying portion formed on a portion of said waveguide for amplifying light transmitted in said waveguide.

19. An optical information system according to claim 18, wherein said amplifying portion comprises a laser amplifier for effecting operation of a traveling wave type.

20. An optical information system according to claim 11 further comprising an isolator provided between said branching-off portion and said first and second laser light sources.

* * * * *

UNITED STATES PATENT AND TRADEMARK OFFICE
CERTIFICATE OF CORRECTION

PATENT NO. : 5,222,163
DATED : June 22, 1993
INVENTOR(S) : UUICHI HANDA ET AL.

It is certified that error appears in the above-identified patent and that said Letters Patent is hereby corrected as shown below:

Title page:

AT [56] REFERENCES CITED

Foreign Patent Documents,
"62-145225 12/1987 Japan" should read
62-145225 6/1987 Japan-- and
"3200105" should read --3-200105--.

COLUMN 1

Line 37, "multiplexing" should read --multiplexed--.
Line 66, "several," should read --several--.

COLUMN 6

Line 10, "wavelength" should read --wavelength.--.

COLUMN 7

Line 5, "wavelengths." should read --waveguide.--.
Line 7, "where in" should read --wherein--.
Line 21, "where" should read --wherein--.

UNITED STATES PATENT AND TRADEMARK OFFICE
CERTIFICATE OF CORRECTION

PATENT NO. : 5,222,163
DATED : June 22, 1993
INVENTOR(S) : UUICHI HANDA ET AL.

Page 2 of 2

It is certified that error appears in the above-identified patent and that said Letters Patent is hereby corrected as shown below:

<u>COLUMN 8</u>

Line 32, "12" should read --11,--.
Line 40, "11" should read --11,--.

Signed and Sealed this

Twenty-sixth Day of April, 1994

Attest:

BRUCE LEHMAN

Attesting Officer

Commissioner of Patents and Trademarks